United States Patent
Hachiya et al.

(10) Patent No.: US 6,211,958 B1
(45) Date of Patent: Apr. 3, 2001

(54) ELECTRONIC COMPONENT MOUNTING APPARATUS

(75) Inventors: Eiichi Hachiya, Katano; Akira Noudo; Atsushi Tanabe, both of Kadoma, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/380,821

(22) PCT Filed: Mar. 11, 1998

(86) PCT No.: PCT/JP98/01035

§ 371 Date: Nov. 18, 1999

§ 102(e) Date: Nov. 18, 1999

(87) PCT Pub. No.: WO98/41078

PCT Pub. Date: Sep. 17, 1998

(30) Foreign Application Priority Data

Mar. 12, 1997 (JP) .................................................... 9-57421

(51) Int. Cl.⁷ .................................................... G01B 11/24
(52) U.S. Cl. .............................. 356/376; 29/759; 382/151
(58) Field of Search .................................... 356/375, 239.1, 356/237.2, 237.4, 237.5, 394, 376; 29/832, 740, 759, 833, 721; 414/783; 901/47; 348/87, 126; 382/145, 151, 147, 266

(56) References Cited

U.S. PATENT DOCUMENTS

| | | | |
|---|---|---|---|
| 4,628,464 | * | 12/1986 | McConnell ............................ 364/513 |
| 4,812,666 | * | 3/1989 | Wistrand ................................ 901/47 |
| 5,260,779 | * | 11/1993 | Wasserman ............................ 358/93 |
| 5,420,691 | * | 5/1995 | Kawaguchi ........................... 356/375 |
| 5,741,114 | * | 4/1998 | Onodera ................................ 414/783 |
| 5,839,186 | * | 11/1998 | Onodera ................................. 29/720 |

FOREIGN PATENT DOCUMENTS

| | | |
|---|---|---|
| 0449481A1 | 10/1991 | (EP) . |
| 0596533A1 | 5/1994 | (EP) . |
| 7-176896 | 7/1995 | (JP) . |
| 8-205004 | 8/1996 | (JP) . |

\* cited by examiner

*Primary Examiner*—Hoa Q. Pham
(74) *Attorney, Agent, or Firm*—Jordan and Hamburg LLP

(57) ABSTRACT

An electronic component mounting device permits recognition of an electronic component for precise mounting. A recognizing device includes a line camera having a one-dimensional CCD array, a shutter camera having a shutter function, and a device for selecting either the line camera or the shutter camera depending on the size or shape of the electronic components. The electronic components are recognized by image data obtained by a selected one of the cameras while the electronic component is moving along a movement path of a mounting head towards a mounting location.

9 Claims, 6 Drawing Sheets

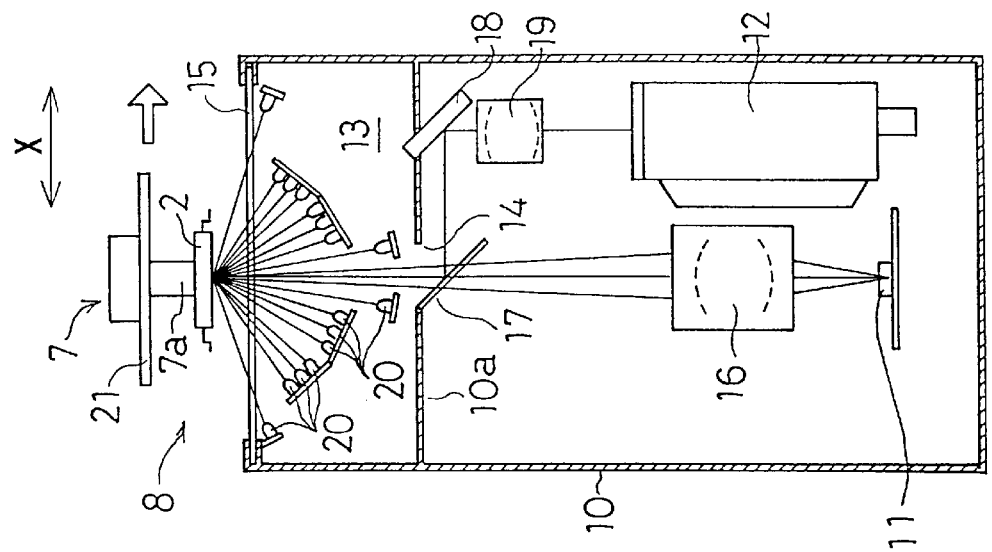
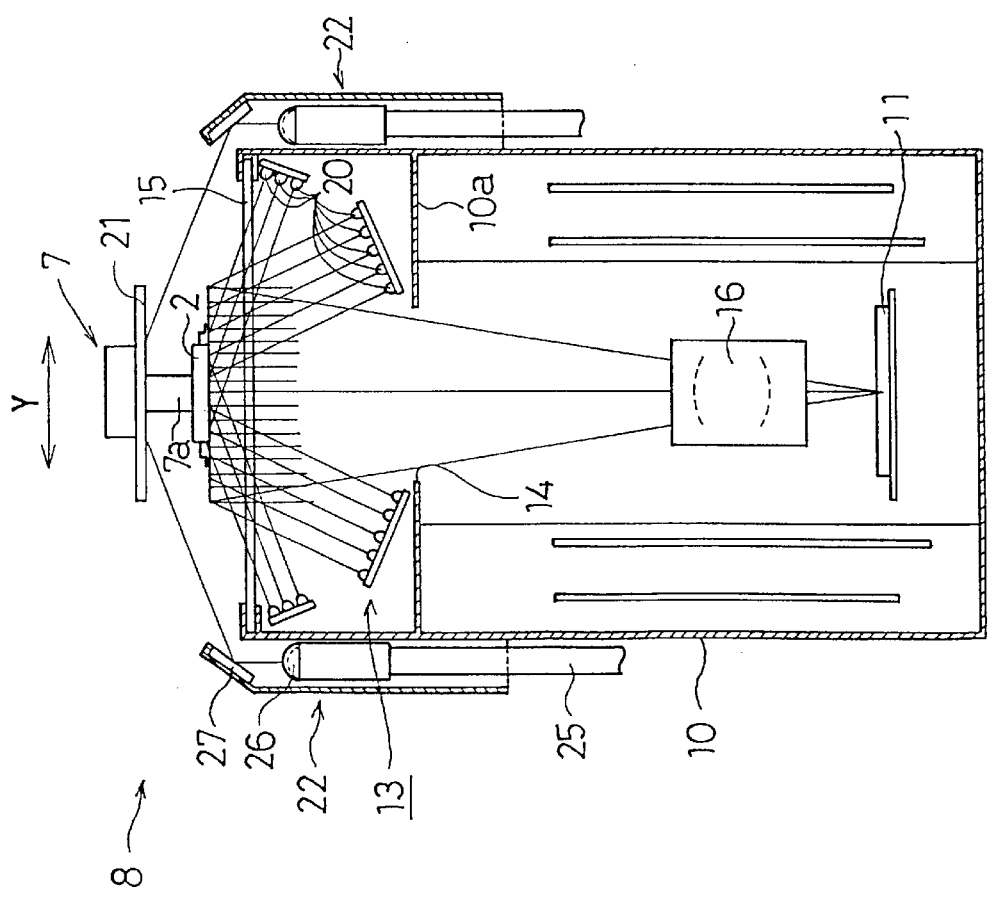

ELECTRONIC COMPONENT MOUNTING APPARATUS

BACKGROUND OF THE INVENTION

The present invention relates to a method for mounting an electronic component on a substrate and an apparatus for implementing the method, and particularly to an electronic component mounting apparatus provided with a recognizing means of inexpensive construction which is capable of recognizing electronic components of various sizes during they are moved.

A known conventional electronic component mounting apparatus is constructed such that a mounting head driven for movement by a driver holds an electronic component at a feed station, and pauses at a particular position of a recognition station where the electronic component is monitored with a recognizing camera before being moved to a mounting station, where the electronic component is precisely positioned and mounted on a substrate.

However, in such a construction, the mounting head has to be paused each time at the particular position of the recognition station for recognition of the electronic component, thus increasing the mounting tact and limiting the improvement of productivity.

For overcoming such a drawback, a modified electronic component mounting apparatus employs a line camera with a one-dimensional CCD array as the recognition camera, with which an image of electronic component held with the mounting head being moved is picked up for recognition of their held location.

Another modified apparatus is known which employs a shutter camera for taking a two-dimensional image of electronic component held with the mounting head being moved to monitor their location.

Line cameras having a one-dimensional CCD array has an advantage of high resolution in comparison with other types of cameras and thus are suitable for taking images and recognizing components of large size with high accuracy. When taking images with a line camera, in order to maintain the ratio of length to breadth of the image, it is necessary to move an object of which image is being picked up in a direction vertical to the lengthwise direction of the arrangement of the CCD by a distance which is equivalent to a length of the object assigned to each pixel of CCD during the scanning action of one line. The higher the resolution is needed, the shorter the distance of moving the object within a period of transfer of one line is decreased. Moreover, as the transfer of an image data with thousands of pixels from the CCD takes a considerable length of time, the moving speed of the electronic component above the line camera cannot be increased.

Theoretically, shutter cameras may have better capacity of taking images at a high speed due to the emission of a light with high brightness in a short time by utilizing their shutter function. However, since a common two-dimensional CCD array which is applicable to image taking at a high speed comprises about 500×500 pixels and has a field of view bound in extension, the size of electronic component as the object to be monitored is limited in order for maintaining the resolution power above a certain level.

There are actually high-speeded line cameras or cameras of high resolving power having a sensor with 2000×2000 pixels and being capable of scanning at 60 MHz, but their prices are exorbitant and thus they cannot be applied to such a field as the electronic component mounting devices.

In view of the foregoing, it is an object of the present invention to provide an electronic component mounting method and an apparatus of inexpensive construction for implementing the method, by which it is possible to accurately recognize various sizes of electronic components which are being moved for precise mounting on to a substrate.

SUMMARY OF INVENTION

An electronic component mounting apparatus according to one aspect of the present invention is characterized by having a mounting head for holding and moving an electronic component to a mounting location and for mounting it on a substrate, and a recognizing means disposed below a movement path of the mounting head for recognizing the electronic component held on the mounting head, wherein the recognizing means comprises a line camera having a one-dimensional CCD array, a shutter camera having a shutter function, and a selecting means for selecting either the line camera or the shutter camera depending on the size or shape of the electronic component so that the electronic component can be recognized before being mounted by an image data obtained through picking up an image thereof while being moved by the mounting head. Since the image pick-up is selectively made either by the line camera or the shutter camera depending on the size or shape of the electronic component, it is possible to recognize the electronic component of both large and small size precisely at a high moving speed with an image of a necessary level of resolving power. Efficient and precise mounting of electronic component of various sizes can be thereby performed.

Also, by projecting the image of the electronic component held and moved by the mounting head simultaneously via a light path dividing means to both the line camera and the shutter camera which are focused to the same location on the path of movement of the electronic component held on the mounting head, the electronic component can be recognized while being moved along the identical path of movement irrespective of their size or shape.

Preferably, the electronic component is illuminated by an illuminating means comprised mainly of groups of LEDs as a light source, and the duration and intensity of the illumination from the LEDs are controlled in accordance with the size of the electronic component or selected type of the cameras. The illumination can be performed for a short moment with a high intensity of light when picking up images by the shutter camera and for a longer time with a lower intensity of light when picking up images by the line camera, whereby an image data can be achieved properly.

Also, by controlling an amount of electric current supplied to the LEDs by means of a switching function of semiconductor switching elements joined in plurality in parallel to each other, the illumination with a high intensity of light can be achieved by causing a large amount of current to flow to the LEDs by conducting all the semiconductor switching elements for a short time.

Preferably, the LEDs are aligned in two groups, one for directing light to illuminate the focusing point of the line camera linearly and the other for directing light to illuminate a field of view at the focusing point of the shutter camera, and the controlling means selectively activates the two groups of the LEDs. The illumination with a sufficient intensity of light can be thereby effectively achieved.

Also, by providing a reflection plate such as to locate above the electronic component held on the mounting head as well as an illuminating means for illuminating the electronic component from behind when picking up its image including a halogen lamp arranged as a light source for emitting light to the reflection plate, a transmitting image of the electronic component can be taken while being moved.

Preferably, the electronic component is illuminated by an illuminating means including a group of LEDs as a light source for directly illuminating the electronic component and a halogen lamp for emitting light to a reflection plate provided above the electronic component, and the illumination with the LEDs is controlled by semiconductor switching elements while the illumination with the halogen lamp is controlled by a mechanical shutter means provided across the light path of the halogen lamp. The switchover between the image pick-up with the illumination by the reflected light and by the transmitting light can be instantly achieved with higher response.

BRIEF DESCRIPTION OF DRAWINGS

FIG. 2A is a longitudinal cross sectional side view and

FIG. 2B is a longitudinal cross sectional front view, both showing a detailed construction of a recognizing means of the embodiment;

DETAILED DESCRIPTION OF THE PREFERRED EMBODIMENT

Figure 1:
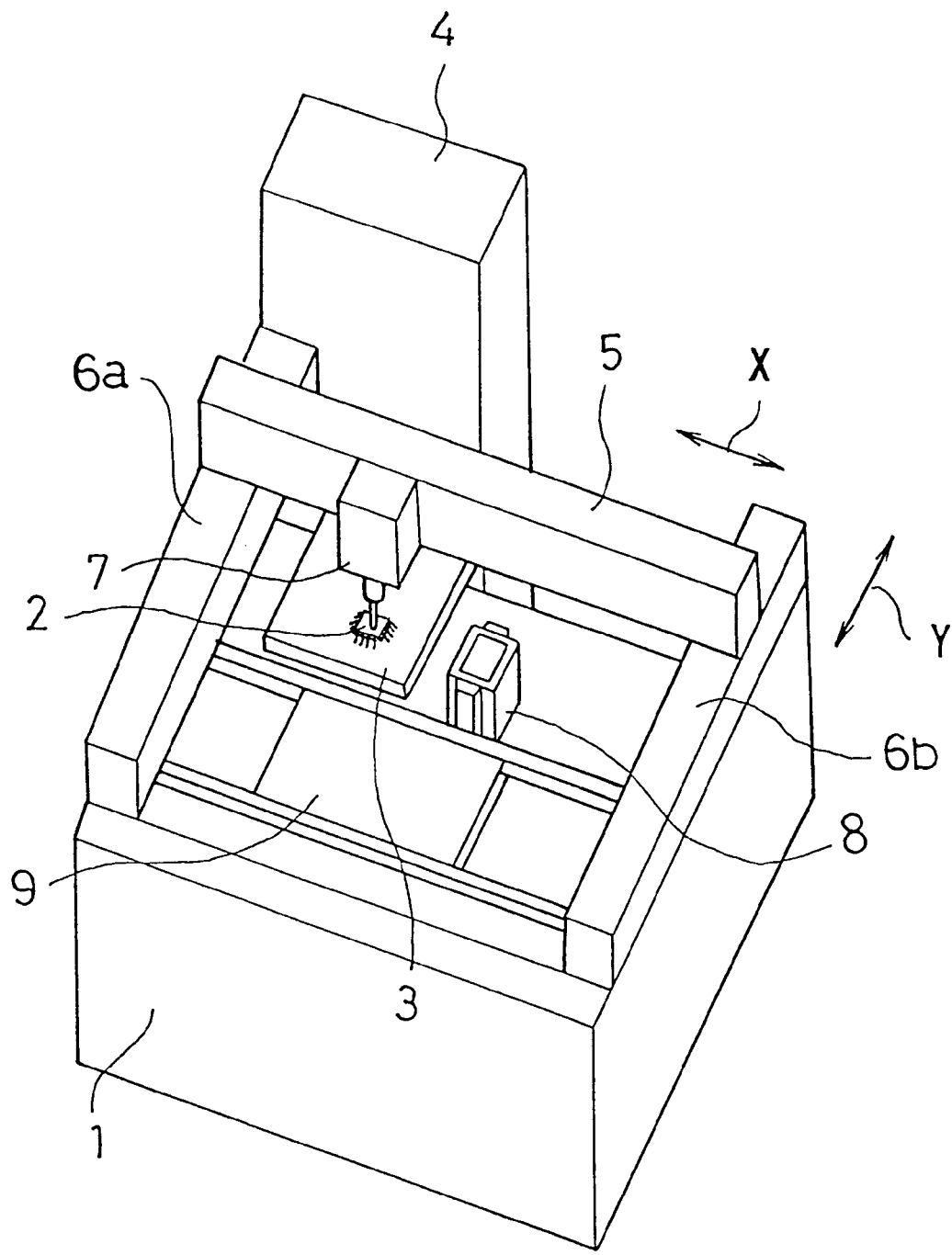
FIG. 1 is a perspective view showing an overall construction of an electronic component mounting apparatus according to one embodiment of the present invention.

Preferred embodiments of the electronic component mounting apparatus according to the present invention will be hereinafter described referring to FIG. 1 to FIG. 8. As shown in the schematic perspective view of FIG. 1 showing an overall construction of the electronic component mounting apparatus of this embodiment, reference numerals 1, 2, and 3 respectively denote a mounting apparatus main body, electronic components, and a tray on which the electronic components 2 are stored. The apparatus further comprises a tray feeder 4 acting as a parts feeder for automatically delivering the tray 3 to a predetermined location, a mounting head 7 for picking up by suction the electronic components 2 from the tray 3 and mounting them on to a substrate 9, an X-axis moving means 5 for moving the mounting head 7 along the X-axis direction, and two Y-axis moving means 6a and 6b for moving the mounting head 7 along the Y-axis direction. The X-axis and Y-axis are on a horizontal plane and crossing at right angles with each other. A recognizing means 8 is provided for recognizing the position and the shape of the electronic components 2 held on the mounting head 7 while they are moved just above the recognizing means 8 in the direction of X-axis. The amount of displacement with respect to the central position of the electronic component 2 held on the mounting head 7 is thereby detected, and based on the result of detection, the position of the mounting head 7 at the time of mounting the electronic components 2 is corrected, so as to mount the components 2 precisely at prescribed locations on the substrate 9.

The recognizing means 8 is constructed as shown in FIG. 2, in which a line camera 11 and a shutter camera 12 are disposed at a lower part within a rectangular parallelepiped casing 10 which is longer in the direction of the Y-axis as viewed in a plan view. The line camera 11 comprises a one-dimensional array of CCD extending along the Y-axis direction within the casing 10. The shutter camera 12 having a shutter function is located on one side of the line camera 11 in the X-axis direction. An illumination chamber 13 is provided in an upper part of the casing 10 as defined by a partition 10a. An oblong slot 14 is formed in the partition 10a extending along the Y-axis direction for allowing an image of the electronic component 2 held with the mounting head 7 being moved along the X-axis direction to be projected on to the line camera 11 and the shutter camera 12. The upper side of the casing 10 is covered with a transparent glass plate 15.

A focusing lens system 16 is provided above the line camera 11 for focusing a Y-axis directional linear image on the one-dimensional CCD array of the line camera 11. A half mirror 17 is mounted at a lower side of the slot 14 of the partition 10a such as to be tilted at the angle of 45° with respect to the vertical optical axis of the focusing lens system 16. Opposing to this half mirror 17 just above the shutter camera 12 is a mirror 18 tilted at the angle of 45°. A focusing lens system 19 is mounted below the mirror 18 for focusing an image of the electronic component 2, which is within a relatively small field of view, e.g. 8×8 mm, on the optical axis of the focusing lens system 16, on the two-dimensional CCD array of the shutter camera 12. A beam splitter may be employed instead of the half mirror 17.

A multiplicity of LEDs 20 are mounted in the illumination chamber 13 as illuminating means for illuminating the electronic component 2 from different directions when taking the image. The LEDs 20 are aligned such as not to interfere with the linear image of the electronic component 2 projected to the line camera 11 and the image of the electronic component 2 which is projected to the shutter camera 12 in a relatively small field of view. One group of the LEDs 20 is arranged to focus their light beams linearly on the focusing point of the line camera 11 and the other group is arranged to focus their light beams on the field of view at the focusing point of the shutter camera 12.

Figure 3:
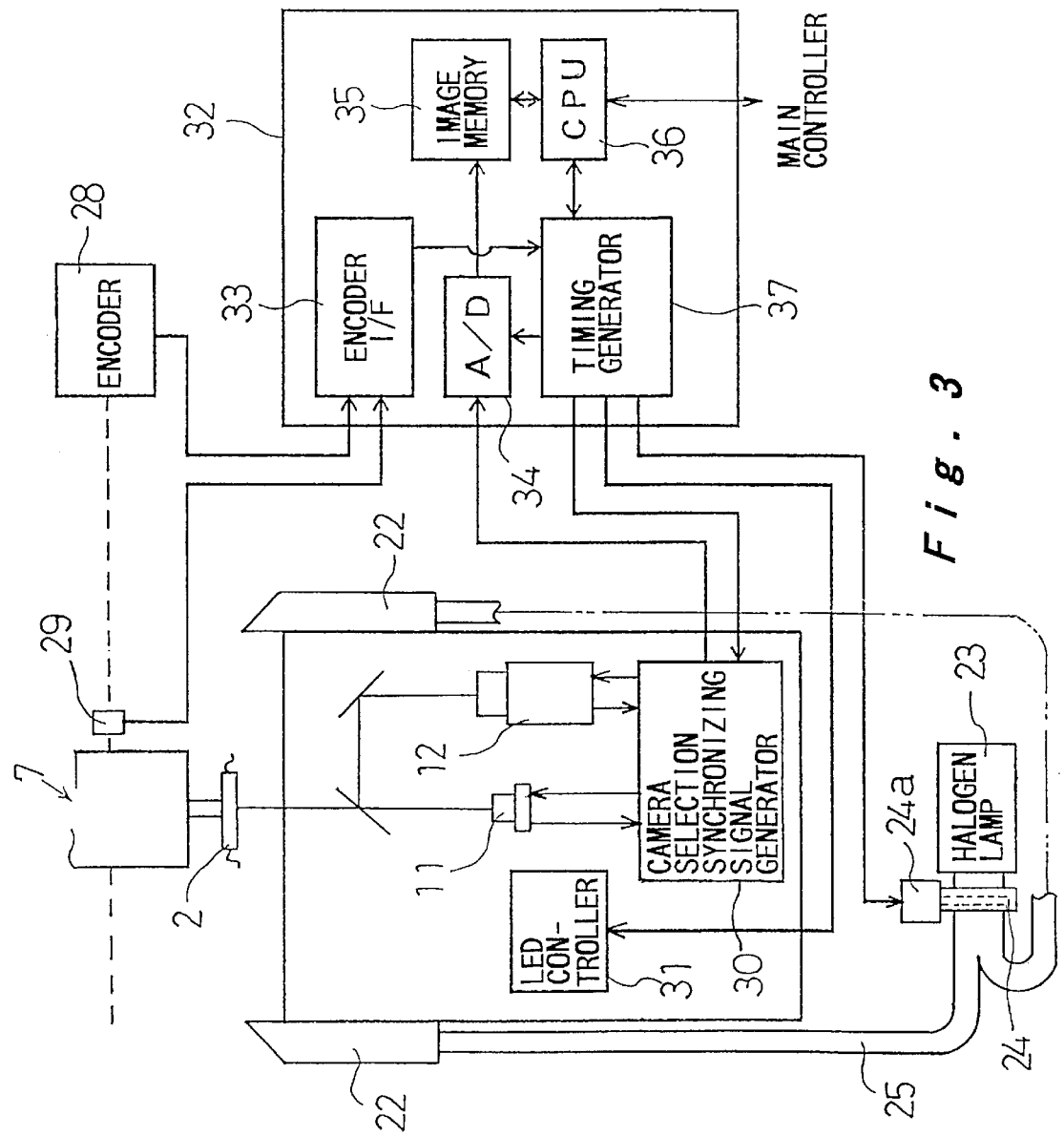
FIG. 3 is a block diagram of a control circuit for the recognizing means in the embodiment.

A reflector 21 is provided above a suction nozzle 7a of the mounting head 7 for illuminating the electronic component 2 from above so that the image of the electronic component 2 is taken by the transmitting light. A pair of light projectors 22 are mounted on both outer sides of the casing 10 along the Y-axis direction for directing beams of light to the reflector 21. As shown in FIGS. 2 and 3, the light projector 22 each comprises an optical fiber 25 connected via a mechanical shutter 24 to a halogen lamp 23, a projector lens 26 mounted to the distal end of the optical fiber 25, and a reflection mirror 27 for reflecting a light projected vertically upward to the reflector 21.

The control circuit for the recognizing means 8 is now explained referring to FIG. 3. The X-axis moving means 5 for the mounting head 7 includes an encoder 28 for detecting the amount of movement of the mounting head 7 and a position detecting sensor 29 for detecting the arrival of the mounting head 7 at a location where the recognition with the recognizing means 8 is started. Also, a camera selection/ synchronizing signal generator 30 for selecting either the line camera 11 or the shutter camera 12 and for generating a synchronizing signal, and for outputting an image signal from the selected camera is mounted along with an LED controller 31 in the casing 10 of the recognizing means 8. Reference numeral 32 denotes a controller for the recognizing means 8, which comprises an encoder I/F 33 for receiving detection signals from the encoder 28 and the position detecting sensor 29, an A/D converter 34 for converting the image signals from the camera 11 or 12 supplied from the camera selection/synchronizing signal generator 30, an image memory 35 for saving the converted image signals, a CPU 36 for reading the image data from the image memory 35 to carry out recognition process of the electronic component 2, delivering a result of recognition to a main controller which controls the entire action of the electronic component mounting apparatus, and receiving from the main controller commands of operation and information about types or models of the electronic component 2, and a timing generator 37 for generating various timing signals to time the actions of the A/D converter 34, the camera selection/synchronizing signal generator 30, the LED controller 31, and a drive unit 24a of the mechanical shutter 24 based on the signals and commands from the encoder I/F 33 and the CPU 36.

Figure 4:
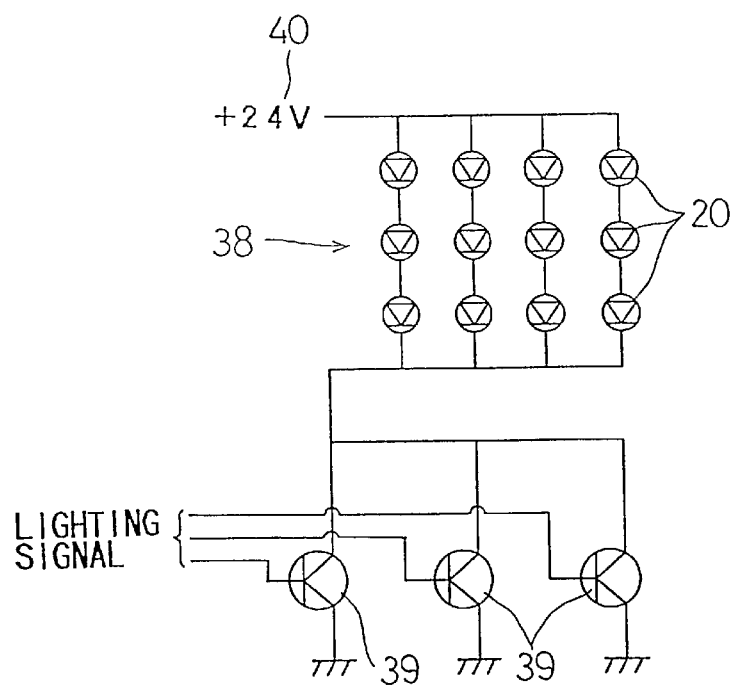
FIG. 4 is a diagram showing an illumination control circuit for LEDs in the embodiment.

As shown in FIG. 4, a number of LEDs that are connected in series are connected in parallel, forming one unit 38 of LED. The LED units 38 and a group of switching elements 39 that are connected to each LED unit 38 in parallel are connected between a power source 40 and the ground. The switching elements 39 are also connected to the timing generator 37 for receiving lighting signals therefrom. When picking up an image of the electronic component 2 by the shutter camera 12, since a high intensity of illumination is required for an instant, all the switching elements 39 are conducted for a short moment to allow a great amount of current to flow for causing the LEDs 20 to emit the light with high brightness for the moment of taking the image. When picking up the image by the line camera 11, since the illumination is required continuously during the electronic component 2 travels a predetermined distance, one or two of the switching elements 39 are conducted so as to light up the LEDs 20 for a longer time.

The action of the recognizing means 8 will be described below. First, the actions of the recognizing means 8 in the case where the electronic component 2 to be mounted are of large size within the range of length/breadth dimensions of e.g. 5×5 mm~60×60 mm are described referring to FIGS. 3, 5, and 6.

Figure 5:
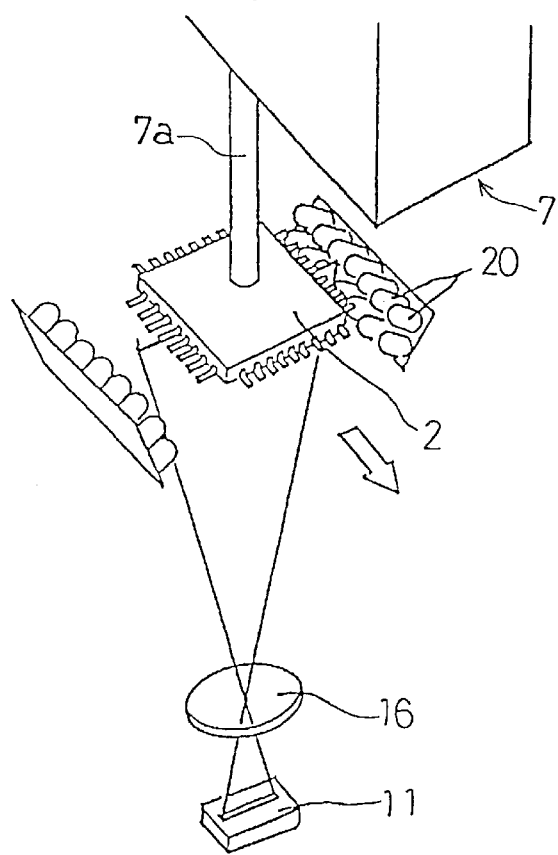
FIG. 5 is a perspective view typically showing an action of taking images with a line camera in the embodiment.

In the case of larger electronic components 2, as shown in FIG. 5, the electronic component 2 held by the mounting head 7 is moved in the X-axis direction and passed across the linear focusing point of the line camera 11 extending along the Y-axis direction so that its entire image is recognized by the line camera 11.

Figure 6:
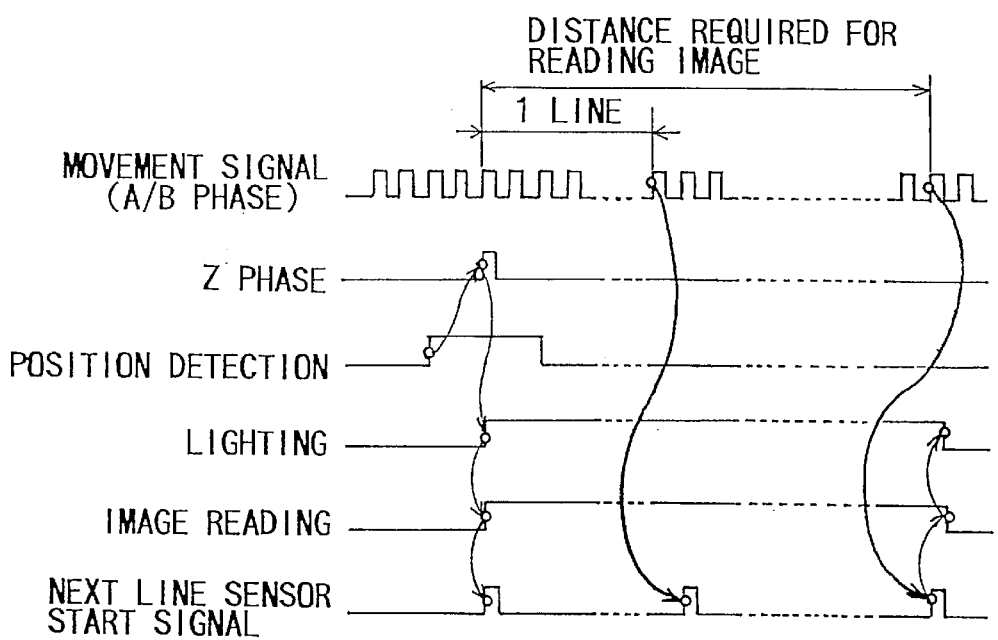
FIG. 6 is a timing chart of the image-taking action of the line camera in the embodiment.

In action, a signal indicating that the object to be recognized is of large size is delivered from the main controller which controls the overall action of the electronic component mounting apparatus to the CPU 36 of the controller 32. The CPU 36 then commands the timing generator 37 to release a timing signal for recognition with the line camera 11. In this state, when the mounting head 7 arrives at the recognition start location of the recognizing means 8, the position detecting sensor 29 outputs a detection signal as shown in FIG. 6. After that, when a Z phase signal, which is the initial position signal for the drive motor of the X-axis moving means 5, is outputted, the LEDs 20 are lighted, and the scanning start signal for the line camera 11 is outputted, thereby starting the image pick-up, and an image of the first line of the electronic component 2 is begun to be captured. Successively, when it is detected from the movement signal of the encoder 28 that the movement corresponding to one line of the image has been made after the release of the Z phase signal, the start signal for scanning the second line is outputted to capture the second line of the image. The series of actions described above are repeated until the movement by the distance for capturing the entire image of the electronic component 2 is completed, when the action of image capture is finished by the next start signal and the LEDs 20 are switched off.

When recognition is made with the line camera 11, it is necessary to illuminate the electronic component 2 throughout the image-taking action with a lower intensity of light than in the case of taking images by the shutter camera 12 which will be described later. Accordingly, one or two of the switching elements 39 shown in FIG. 4 are conducted to provide the LEDs 20 with a standard amount of current to obtain the requisite quantity of light.

Assuming that the maximum dimensions of the electronic component 2 to be monitored are 60×60 mm and the number of pixels of the one-dimensional array CCD of the line camera 11 extending along the Y-axis direction is 1500, the resolving power of 40 µm per pixel in the Y-axis direction is achieved. In accordance with this resolving power, one line of the image is captured each time the object is moved by the distance of 40 µm so as to make the resolving power in the X-axis direction correspond with that in the Y-axis direction. In case that the mounting head 7 is moved at a speed of 400 mm/sec, the duration for capturing one line of the image may be less than 0.1 msec.

Figure 7:
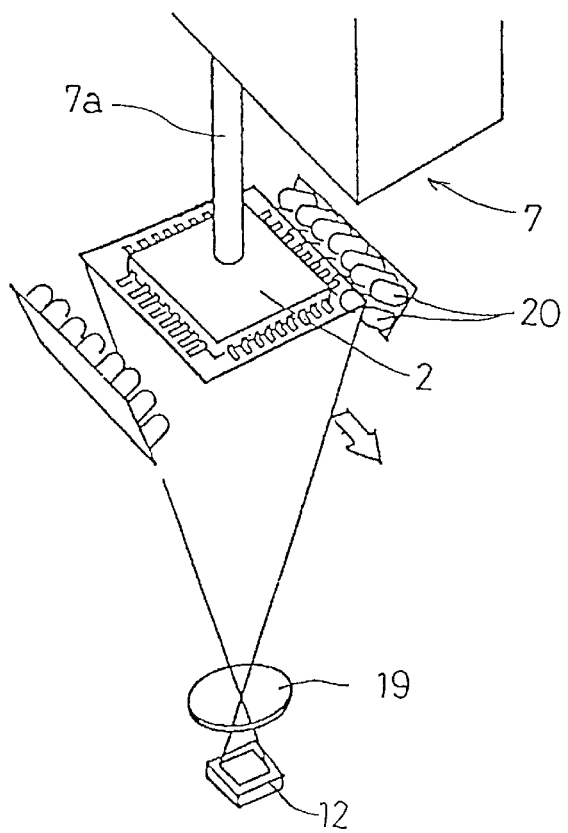
FIG. 7 is a perspective view typically showing an action of taking images with a shutter camera in the embodiment.
Figure 8:
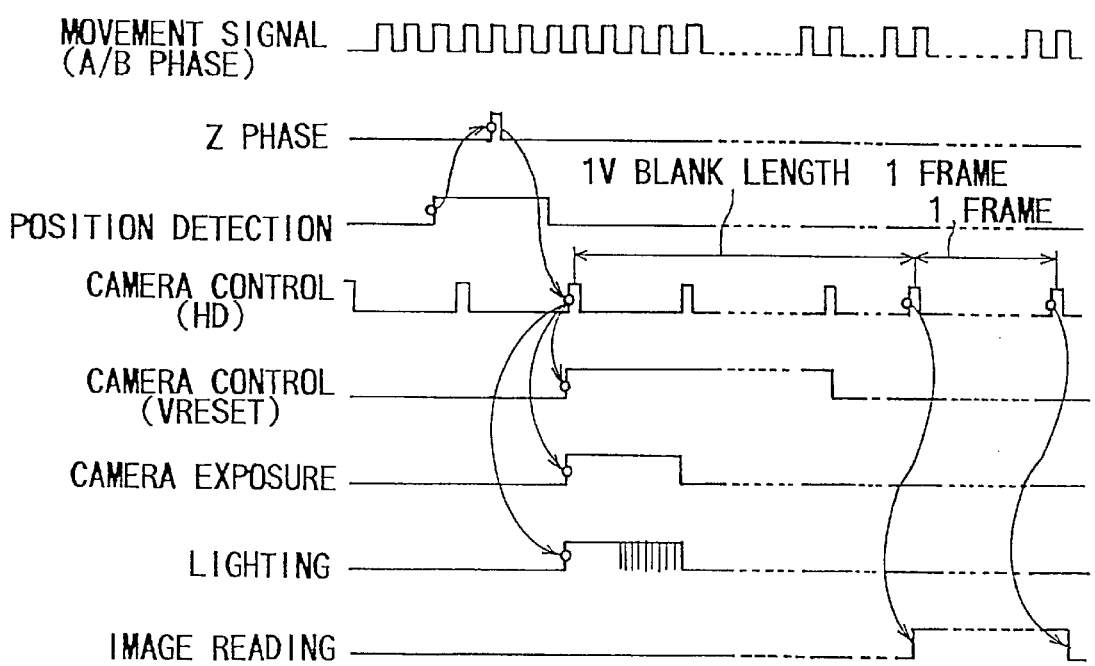
FIG. 8 is a timing chart of the image-taking action of the shutter camera in the embodiment.

Next, the actions of the recognizing means 8 in another case where the electronic component 2 to be mounted is of small size within the range of length/breadth dimensions of e.g. 1.0×0.5 mm~5.0×5.0 mm are described referring to FIGS. 3, 7, and 8. In the case of the electronic component 2 of smaller size, when the electronic component 2 comes to locate within the field of view at the focusing point of the shutter camera 12, it is illuminated and imaged at its entirety as shown in FIG. 7.

In action, a signal indicating that the object to be recognized is of small size is inputted to the CPU 36. The CPU 36 then commands the timing generator 37 to release a timing signal for recognition with the shutter camera 12.

In this state, when the mounting head 7 arrives at the recognition start location of the recognizing means 8, the position detecting sensor 29 generates a detection signal as shown in FIG. 8. After that, when a Z phase signal, i.e., the initial position signal for the drive motor of the X-axis moving means 5, is outputted, a V reset signal for vertical synchronization control of the camera is outputted in synchronism with a horizontal synchronization control signal, which follows immediately after the Z phase signal, and the LEDs 20 are lighted for an instant. At the same time the shutter is opened to expose the two-dimensional CCD array of the shutter camera 12.

After one vertical blanking period (or length), one frame of the image of the two-dimensional CCD array is captured in synchronism with the horizontal synchronization control signal.

It is essential for the recognition with the shutter camera 12 to illuminate the electronic component 2 with a high intensity of light. The illumination with such a high intensity of light is implemented by the LEDs 20 fed with a large amount of current from all the switching elements 39 shown in FIG. 4 being conducted. Since the illumination lasts only for a moment, the LEDs 20 are hardly damaged with the large amount of current.

Assuming that the field of view of the shutter camera 12 is 8×8 mm and the number of pixels of the two-dimensional CCD array of the shutter camera 12 is 512×512, the resolving power of 16 μm per pixel is achieved. Provided that the exposure time is 60 μs when the recognition is made with the mounting head 7 moving at the speed of 200 mm/sec, the distance the electronic component 2 travels during the exposure time is 12 μm. As this is within the level of the above-mentioned resolving power, the image recognition can be accurately performed. By setting the exposure time to be 30 μs, the mounting head 7 can be moved at a higher speed of 400 mm/sec.

Although it has been described in the embodiments above such that the electronic component 2 is illuminated with the LEDs 20 and recognized by the reflected light, it is sometimes preferable to illuminate the electronic component 2 from behind or above and recognized by the transmitting light, depending on the condition of reflection on the surface of the electronic components 2. In that case, instead of using the LEDs 20, the light may be projected from the light projectors 22 to the reflection plate 21, which reflects the light and illuminates the electronic component 2 from above for the image recognition performed similarly as described above. By employing a halogen lamp 23 as the light source, a desired level of the intensity of light can be obtained. The mechanical shutter 24 provides a higher response for controlling the illumination. Thus, the switchover between the image pickup by the reflected light of the illumination with the LEDs 20 and the image pick-up by the transmitting light of the illumination with the halogen lamp 23 can be swiftly effected with the high response. Accordingly, even when a various different kinds of electronic components 2 are held on the mounting head 7 of multi-nozzle type and successively moved above the recognizing means in a short time, the image recognition can be accurately effected.

As described above, according to the embodiment of the present invention, the line camera 11 and the shutter camera 12 is selectively operated depending on the shape or size of the electronic component 2 for picking up an image of the electronic component 2 during it is moved by the X-axis moving means 5 to recognize the electronic component 2 before mounting it on to the substrate. The electronic components 2 of both large and small size can be accurately recognized with an image of high resolution while being moved at a high speed; thus the electronic component 2 of any size can be efficiently and precisely mounted to the substrate. Also, the image of the electronic component 2 is projected via the half mirror 17 to both the line camera 11 and the shutter camera 12 which are focused to the same location on the path of movement of the electronic components 2 held by the mounting head 7. Accordingly, the electronic components 2 can be recognized during it is moved on the identical path of movement irrespective of its size or shape. Further, whether the recognition shall be made with the reflected light or transmitting light can be selected, and this switchover action is made in an instant.

As set forth above, according to the present invention, an electronic component can be accurately recognized with high resolving power during it is moved by a mounting head at a high speed. Accordingly, the present invention can be favourably applied as an electronic component mounting apparatus for mounting the electronic component correctly on a substrate based on the image data of the electronic component.

What is claimed is:

1. An electronic component mounting apparatus, comprising:
   a mounting head for holding and moving an electronic component to a mounting location and for mounting it on a substrate; and
   recognizing means disposed below a movement path of the mounting head for recognizing the electronic component held on the mounting head, said recognizing means including a line camera having a one-dimensional CCD array, a shutter camera having a shutter function, selecting means for selecting one of the line camera and the shutter camera depending on at least one of a size and shape of the electronic component, and synchronizing means for synchronizing operation of a selected one of the line camera and the shutter camera with a movement of the electronic component along the movement path of the mounting head which moves the electronic component towards a mounting location to permit capture of an image of the electronic component while moving, whereby the electronic component can be recognized before being mounted by image data obtained through capture of the image thereof without necessarily requiring movement of the electronic component to be halted.

2. An electronic component mounting apparatus according to claim 1, further comprising light path dividing means for simultaneously projecting the image of the electronic component held and moved by the mounting head to both the line camera and the shutter camera which are focused to the same location on the path of movement of the electronic component held on the mounting head.

3. An electronic component mounting apparatus according to claim 1, further comprising:
   illumination means for illuminating the electronic component, said illuminating means including groups of LEDs as a light source; and
   a controller which permits selective control of the duration and intensity of the illumination from the LEDs in accordance with at least one of the size of the electronic component and selected type of the line and shutter cameras.

4. An electronic component mounting apparatus according to claim 3, further comprising semiconductor switching elements joined in parallel to each other, an amount of electric current supplied to the LEDs being controlled by a switching function of said semiconductor switching elements.

5. An electronic component mounting apparatus according to claim 3, wherein:
   the LEDs are aligned in two groups, one of said two groups for directing light to illuminate a focusing point of the line camera linearly and a remaining one of said two groups for directing light to illuminate a field of view at a focusing point of the shutter camera; and
   the controller selectively activates the two groups of the LEDs.

6. An electronic component mounting apparatus according to claim 1, further comprising:
   a reflection plate disposed in a position above the electronic component held on the mounting head; and
   illumination means for illuminating the electronic component from behind when picking up an image thereof, said illumination means including a halogen lamp arranged as a light source for emitting light to the reflection plate.

7. An electronic component mounting apparatus according to claim 1, further comprising:

a reflection plate disposed in a position above the electronic component;

illumination means for illuminating the electronic component, said illumination means including a group of LEDs as a light source for directly illuminating the electronic component and a halogen lamp for emitting light to a reflection plate;

semiconductor switching elements for controlling illumination by the LEDs; and a mechanical shutter positioned across a light path of the halogen lamp for controlling illumination by the halogen lamp.

8. A method of mounting electronic components, comprising:

providing recognizing means including a line camera having a one-dimensional CCD array and a shutter camera having a shutter function;

selecting one of the line camera and the shutter camera in accordance with at least one of a size and a shape of an electronic component for picking up image data of the electronic component; and synchronizing operation of a selected one of the line camera and the shutter camera with movement of the electronic component held by a mounting head and moved along a movement path of the mounting head towards a mounting location to permit capture of the image data of the electronic component while the electronic component is moving.

9. A method according to claim 8, further comprising:

illuminating the eletronic component by using a light source comprised of groups of LEDs; and controlling a duration and intensity of illumination from the LEDs in accordance with which of the line camera and the shutter camera is the selected one.

* * * * *